(12) United States Patent
Neidorff

(10) Patent No.: US 10,110,220 B1
(45) Date of Patent: Oct. 23, 2018

(54) AUXILIARY MOSFETS FOR SWITCHABLE COUPLING TO A POWER MOSFET

(71) Applicant: TEXAS INSTRUMENTS INCORPORATED, Dallas, TX (US)

(72) Inventor: Robert Alan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/617,626

(22) Filed: Jun. 8, 2017

(51) Int. Cl.
| H03B 1/00 | (2006.01) |
| H03K 3/00 | (2006.01) |
| H03K 17/687 | (2006.01) |
| G05F 1/10 | (2006.01) |
| G01R 19/00 | (2006.01) |

(52) U.S. Cl.
CPC ..... H03K 17/6871 (2013.01); G01R 19/0092 (2013.01); G05F 1/10 (2013.01)

(58) Field of Classification Search
CPC ...... H03K 17/6871; G05F 1/10; G01R 19/00; G01R 19/0038; G01R 19/0092; G01R 19/10
USPC .... 327/108–112, 427, 434, 437, 538, 63–79, 327/540–543, 309; 323/265, 272, 277, 323/282; 326/82, 83, 87; 324/123 R
See application file for complete search history.

(56) References Cited

U.S. PATENT DOCUMENTS

| 5,764,041 A * | 6/1998 | Pulvirenti | G05F 1/573 323/273 |
| 9,024,678 B2 * | 5/2015 | Vacca Cavalotto | G01R 19/0092 323/314 |
| 9,800,237 B2 * | 10/2017 | Akama | H03K 17/0406 |
| 9,917,437 B2 * | 3/2018 | Sun | H02H 9/004 |
| 2002/0033727 A1 * | 3/2002 | Okamoto | G06F 1/266 327/309 |
| 2004/0155662 A1 * | 8/2004 | Graf | G01R 19/0092 324/522 |
| 2005/0068092 A1 * | 3/2005 | Sano | G05F 1/575 327/541 |
| 2006/0226820 A1 * | 10/2006 | Farkas | G05F 1/573 323/276 |
| 2010/0073034 A1 * | 3/2010 | Valentino | G01R 19/16571 327/77 |
| 2010/0244947 A1 * | 9/2010 | Massie | G01R 19/0092 327/581 |

(Continued)

Primary Examiner — Thomas Skibinski
(74) Attorney, Agent, or Firm — Tuenlap D. Chan; Charles A. Brill; Frank D. Cimino

(57) ABSTRACT

In some embodiments, a system comprises a power metal oxide semiconductor field effect transistor (MOSFET) configured to provide power in the system, a plurality of auxiliary MOSFETs, and a switch network configured to switchably and simultaneously couple a first of the plurality of auxiliary MOSFETs to the power MOSFET and a second of the plurality of auxiliary MOSFETs to a feedback voltage regulator. The switch network is further configured to switchably and simultaneously couple the first of the plurality of auxiliary MOSFETs to the feedback voltage regulator and the second of the plurality of auxiliary MOSFETs to the power MOSFET. The feedback voltage regulator is configured to cause a voltage at one or more of the plurality of auxiliary MOSFETs to match a voltage at the power MOSFET.

20 Claims, 2 Drawing Sheets

(56) References Cited

U.S. PATENT DOCUMENTS

| | | | |
|---|---|---|---|
| 2010/0329304 A1* | 12/2010 | Doorenbos | G01K 7/01 374/178 |
| 2012/0049628 A1* | 3/2012 | Vemulapalli | H02J 7/345 307/43 |
| 2016/0118976 A1* | 4/2016 | Boianceanu | H03K 17/145 327/427 |

* cited by examiner

AUXILIARY MOSFETS FOR SWITCHABLE COUPLING TO A POWER MOSFET

BACKGROUND

An electronic system will typically include a power supply to provide power to one or more components within the system. The system may include one or more power metal oxide semiconductor field effect transistors (MOSFETs) to facilitate the provision of power from the power supply to the system components. It is often useful to measure the amount of power provided to any particular component—for example, to determine whether particular components are overburdened. Power sensing systems often leverage power MOSFETs to perform such measurements.

SUMMARY

At least some embodiments are directed to a system that comprises a power metal oxide semiconductor field effect transistor (MOSFET) configured to provide power in the system, a plurality of auxiliary MOSFETs, and a switch network configured to switchably and simultaneously couple a first of the plurality of auxiliary MOSFETs to the power MOSFET and a second of the plurality of auxiliary MOSFETs to a feedback voltage regulator. The switch network is further configured to switchably and simultaneously couple the first of the plurality of auxiliary MOSFETs to the feedback voltage regulator and the second of the plurality of auxiliary MOSFETs to the power MOSFET. The feedback voltage regulator is configured to cause a voltage at one or more of the plurality of auxiliary MOSFETs to match a voltage at the power MOSFET.

At least some embodiments are directed to a system that comprises a main metal oxide semiconductor field effect transistor (MOSFET) configured to provide power. The system also comprises first, second, and third auxiliary MOSFETs, the main MOSFET and the first, second, and third auxiliary MOSFETs driven by a common gate drive signal. The system further includes a feedback voltage regulator comprising an amplifier and a feedback MOSFET, an input of the amplifier coupled to a drain of the main MOSFET. In addition the system comprises a switch network coupled to the main MOSFET, the feedback voltage regulator, and the first, second, and third auxiliary MOSFETs. In a first state, the switch network is configured to couple drains of the first and second auxiliary MOSFETs to the drain of the main MOSFET while the switch network couples the drain of the third auxiliary MOSFET to another input of the amplifier. The amplifier is configured to adjust the feedback MOSFET to cause a voltage at the drain of the third auxiliary MOSFET to match a voltage at the drain of the main MOSFET. In a second state, the switch network is configured to couple the drains of the second and third auxiliary MOSFETs to the drain of the main MOSFET while the switch network couples the drain of the first auxiliary MOSFET to the another input of the amplifier. The amplifier is configured to adjust the feedback MOSFET to cause a voltage at the drain of the first auxiliary MOSFET to match the voltage at the drain of the main MOSFET. In a third state, the switch network is configured to couple the drains of the first and third auxiliary MOSFETs to the drain of the main MOSFET while the switch network couples the drain of the second auxiliary MOSFET to the another input of the amplifier. The amplifier is configured to adjust the feedback MOSFET to cause a voltage at the drain of the second auxiliary MOSFET to match the voltage at the drain of the main MOSFET.

At least some embodiments are directed to a method that includes providing power through a main switch, exposing the main switch to a first set of electrical and switching conditions, exposing a first auxiliary switch to the first set of electrical and switching conditions and simultaneously exposing a second auxiliary switch to a second set of electrical and switching conditions, and measuring a current flowing through the second auxiliary switch while exposing the second auxiliary switch to the second set of electrical and switching conditions. The method also includes exposing the first auxiliary switch to the second set of electrical and switching conditions and simultaneously exposing the second auxiliary switch to the first set of electrical and switching conditions, and measuring another current flowing through the first auxiliary switch while exposing the first auxiliary switch to the second set of electrical and switching conditions.

BRIEF DESCRIPTION OF THE DRAWINGS

For a detailed description of various examples, reference will now be made to the accompanying drawings in which.

DETAILED DESCRIPTION

Figure 1:
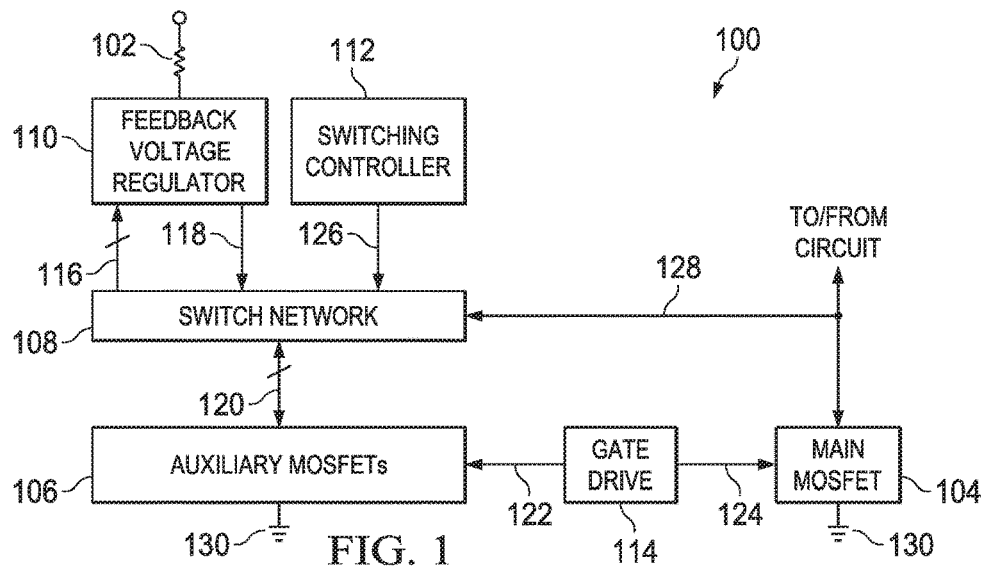
FIG. 1 is a conceptual block diagram of an illustrative senseFET system in accordance with various examples.

As explained above, power sensing applications often leverage power metal oxide semiconductor field effect transistors (MOSFETs) to perform power measurements. The senseFET is a common type of power sensing system. A senseFET typically comprises two primary components: a high current power MOSFET and a smaller, lower current reference MOSFET (or "sense" MOSFET). These two MOSFETs are usually sourced from the same semiconductor wafer, and so the sizing ratio between them may be well-defined. Accordingly, in power sensing applications, a current flowing through the sense MOSFET may be measured and multiplied by the sizing ratio to determine the current flowing through the power MOSFET.

Power MOSFETs, however, age with time, and this aging process often causes instability (or "drifting") of the sizing ratio between the power MOSFET and the sense MOSFET. Sizing ratio instability makes it difficult to use the sense MOSFET current to accurately determine the power MOSFET current. Sizing ratio instability is intensified by certain operating conditions that may regularly affect the power MOSFET, such as repeated switching when the power MOSFET is in a high-voltage, high-current environment. For example, if a high drain-to-source voltage is present across a power MOSFET that is conducting a high current, a powerful electric field is generated in the power MOSFET channel. This electric field results in the presence of "hot carriers," which are electrons with velocity so great that they leave the semiconductor lattice structure and embed into an insulator. These hot carriers are thus trapped in the insulator and then generate their own electric field, which, in turn, influences the channel and affects the power MOSFET operating characteristics. The sense MOSFET does not experience the same hot carrier phenomenon at least because it is not exposed to high voltage and high current conditions, as is the power MOSFET. As a result, the sizing ratio between the power MOSFET and the sense MOSFET drifts and can no longer be used to accurately determine power delivered via the power MOSFET.

At least some embodiments disclosed herein present one or more distinct technical advantages over the current art. In particular, the disclosed embodiments mitigate the aforementioned sizing ratio drift between power MOSFETs and sense MOSFETs in senseFET applications. The disclosed embodiments mitigate the ratio drift by including a large power MOSFET and multiple smaller, auxiliary MOSFETs. Each of the auxiliary MOSFETs may switchably couple to the power MOSFET and to a feedback voltage regulator/ sense resistor combination. At any given time, one of the auxiliary MOSFETs may couple to the feedback voltage regulator/sense resistor combination, while the remaining auxiliary MOSFET(s) may couple to the power MOSFET. These switchable couplings may be regularly rotated so that each of the auxiliary MOSFETs spends roughly the same amount of time as the other auxiliary MOSFETs being coupled to the feedback voltage regulator/sense resistor combination and to the power MOSFET. By regularly coupling each of the auxiliary MOSFETs to the power MOSFET, the auxiliary MOSFETs and the power MOSFET may be exposed to the same electrical conditions (e.g., voltage and maximal current) and the same switching conditions (identical switching conditions are achieved by coupling the gates, drains, and sources of the auxiliary MOSFETs to the gate, drain, and source of the power MOSFET, respectively; the term "switching conditions" may include the presence or absence of any switching). By ensuring that the auxiliary MOSFETs are exposed to the same electrical and switching conditions as the power MOSFET, some or all of the MOSFETs in the senseFET may experience the hot carrier phenomenon to similar extents, thus mitigating sizing ratio drift between MOSFETs and preserving the ability to accurately determine current flow through the power MOSFET.

FIG. 1 is a conceptual block diagram of an illustrative senseFET system 100 in accordance with various examples. The system 100 may include a sense resistor or other sense element 102 (e.g., 1 kOhms); a main MOSFET 104 that may comprise a power MOSFET; a plurality of auxiliary MOSFETs 106, each of which may be sourced from the same semiconductor wafer as the main MOSFET 104 and may be smaller than the main MOSFET 104; and a feedback voltage regulator 110 coupled to the sense resistor 102 and to a switch network 108 for regulating the voltages at each of the auxiliary MOSFETs 106 via a feedback loop comprising connections 116 and 118. The switch network 108 may comprise a plurality of switches for switchably coupling each of the auxiliary MOSFETs 106 to the main MOSFET 104 and to the feedback voltage regulator 110/sense resistor 102 combination via connections 120. The system 100 may further comprise a gate drive 114 configured to drive the gates of the auxiliary MOSFETs 106 and the main MOSFET 104 via connections 122 and 124, respectively. The system 100 may additionally include a switching controller 112 configured to control the switching action of the switches in the switch network 108 via connection 126. The switch network 108 couples to the main MOSFET 104 and/or to a circuit via a connection 128. Similarly, the main MOSFET 104 couples to such a circuit via the connection 128. Such a circuit may include any suitable circuitry to which the main MOSFET 104 provides power or from which the main MOSFET 104 receives power. A ground connection 130 may be established with various components of the system 100, such as the auxiliary MOSFETs 106 and the main MOSFET 104. In at least some embodiments, the auxiliary MOSFETs 106 comprise n-type MOSFETs, although p-type MOSFETs or other types of transistors also may be used. In at least some embodiments, the main MOSFET 104 comprises an n-type MOSFET, although a p-type MOSFET or other types of transistors also may be used. The remainder of this discussion assumes the use of n-type MOSFETs in the auxiliary MOSFETs 106 and the main MOSFET 104, although the scope of disclosure is not limited as such.

In operation, the gate drive 114 may provide a common gate control signal via connections 122 and 124 to the auxiliary MOSFETs 106 and the main MOSFET 104. In addition, the sources of the auxiliary MOSFETs 106 and the main MOSFET 104 all couple to the ground connection 130. The switch network 108, based on control signals received from the switching controller 112 via connection 126, may switchably couple each of the auxiliary MOSFETs 106 to either the main MOSFET 104 or the feedback voltage regulator 110/sense resistor 102 combination. By "switchably couples," it is meant that a switch in the switch network 108, when in a first state, couples a corresponding auxiliary MOSFET 106 to the main MOSFET 104, and that same switch, when in a second state, couples the corresponding auxiliary MOSFET 106 to the feedback regulator 110/sense resistor 102 combination.

At any given time, the switch network 108 may couple one of the auxiliary MOSFETs 106 to the feedback voltage regulator 110/sense resistor 102 combination and, at the same time, the switch network 108 may couple the remaining auxiliary MOSFETs 106 to the main MOSFET 104 via connection 128. In this way, the auxiliary MOSFET 106 that is coupled to the feedback voltage regulator 110/sense resistor 102 combination functions as a sense MOSFET, and the auxiliary MOSFETs 106 that are coupled to the main MOSFET 104 are exposed to the same electrical and switching conditions as is the main MOSFET 104. This is true because the gates, sources, and drains of all but one of the auxiliary MOSFETs 106 couple to the gate, source, and drain, respectively, of the main MOSFET 104. Thus, the voltage exposure between these auxiliary MOSFETs 106 and the main MOSFET 104 may be identical; at least some of the current flowing toward the main MOSFET 104 is diverted toward the auxiliary MOSFETs 106 that couple to the main MOSFET 104 (e.g., according to a predetermined sizing ratio, since the MOSFETs share a common current density due to identical drain-to-source voltages and identical gate-to-source voltages across the MOSFETs); and the switching patterns may be the same. The switching controller 112 and the switch network 108 may repeatedly change the auxiliary MOSFET 106 that couples to the feedback voltage regulator 110/sense resistor 102 combination so that each of the auxiliary MOSFETs 106 has a turn to couple to the feedback voltage regulator 110/sense resistor 102 combination. When three or more auxiliary MOSFETs 106 are used, at any given moment a single auxiliary MOSFET 106 may couple to the feedback voltage regulator 110/sense resistor 102 combination while the remaining auxiliary MOSFETs 106 may couple to the main MOSFET 104. Alternatively, at any given moment, a single auxiliary MOSFET 106 may couple to the main MOSFET 104 while the remaining auxiliary MOSFETs 106 couple to the feedback voltage regulator 110/sense resistor 102 combination. All such variations are contemplated and fall within the scope of this disclosure.

When any particular auxiliary MOSFET 106 couples to the feedback voltage regulator 110/sense resistor 102 combination, the remaining auxiliary MOSFETs 106 may couple to the main MOSFET 104. Thus, if there are x number of auxiliary MOSFETs 106, each auxiliary MOSFET 106 may spend 1/x of its time acting as a sense MOSFET (i.e., being coupled to the feedback voltage regulator 110/sense resistor 102 combination) and (x−1)/x of its time being exposed to the same electrical and switching conditions as the main MOSFET 104 (i.e., by coupling to the main MOSFET 104). In at least some embodiments, each of the auxiliary MOSFETs 106 is treated equally in terms of the proportion of time spent being coupled to the feedback voltage regulator 110/sense resistor 102 combination and to the main MOSFET 104. In at least some embodiments, a first of the auxiliary MOSFETs 106 couples to the main MOSFET 104 for a first length of time and a second of the auxiliary MOSFETs 106 couples to the main MOSFET 104 for a second length of time that is within a range spanning 90% of the first length of time to 110% of the first length of time, inclusive.

Still referring to FIG. 1, the auxiliary MOSFET 106 that is coupled at any given time to the feedback voltage regulator 110/sense resistor 102 combination may have its drain voltage matched to the drain voltage of the main MOSFET 104. More specifically, the feedback voltage regulator 110 may comprise an operational amplifier (depicted in FIG. 2) having inputs that couple to the drain of an auxiliary MOSFET 106 and to the drain of the main MOSFET 104. The output of the operational amplifier may couple to and control a gate of a feedback MOSFET, also part of the feedback voltage regulator 110, that couples in series with the sense resistor 102. In this way, the feedback voltage regulator 110 matches the drain voltages of the auxiliary MOSFET 106 and the main MOSFET 104. The main MOSFET 104 and the remaining auxiliary MOSFETs 106 coupling directly to the main MOSFET 104 experience identical electrical and switching conditions, and, as a result, they undergo the same hot carrier effects, thus experiencing approximately the same degree of hot carrier "wear and tear." The auxiliary MOSFET 106 that does not couple directly to the main MOSFET 104, however, does not experience the same hot carrier effect. This is at least in part because the main MOSFET 104 and the remaining auxiliary MOSFETs 106 coupling directly to the main MOSFET 104 couple to a common inductance-carrying load. When any of these MOSFETs that couples to the inductance-carrying load is on, the load current changes at a slow rate determined by dI/dt=V/L. As the MOSFET is being switched off, the MOSFET is still partially on and is thus carrying a full current. However, the drain-to-source voltage is no longer a very low voltage; instead, it is rising or is already high. Thus, for a short period of time (e.g., 10 ns), the drain-to-source voltage across the MOSFET is high and the current flow through the MOSFET is also high. As a result of the combination of high voltage and current conditions during switching, the MOSFET experiences hot carriers. This phenomenon is virtually identical for the main MOSFET 104 and the remaining auxiliary MOSFETs 106 coupling directly to the main MOSFET 104. However, the auxiliary MOSFET 106 that does not couple directly to the main MOSFET 104 is not coupled to an inductance-carrying load and thus does not experience the combination of high drain-to-source voltage and high current levels during switching. As a result, this auxiliary MOSFET 106 does not undergo the hot carrier phenomenon until it is later coupled directly to the main MOSFET 104.

The current flowing through the auxiliary MOSFET 106 may be the same as the current flowing through the sense resistor 102. Accordingly, the current through the sense resistor 102 may be measured (e.g., by measuring voltage across the sense resistor 102 and dividing by the known resistance of the sense resistor 102), and that current may be used along with the sizing ratio between the main MOSFET 104 and the auxiliary MOSFET 106 coupled to the sense resistor 102 to determine the current flowing through the main MOSFET 104. The auxiliary MOSFET 106 that is coupled to the sense resistor 102 at any given time may be determined based on the status of the switching controller 112.

Figure 2:
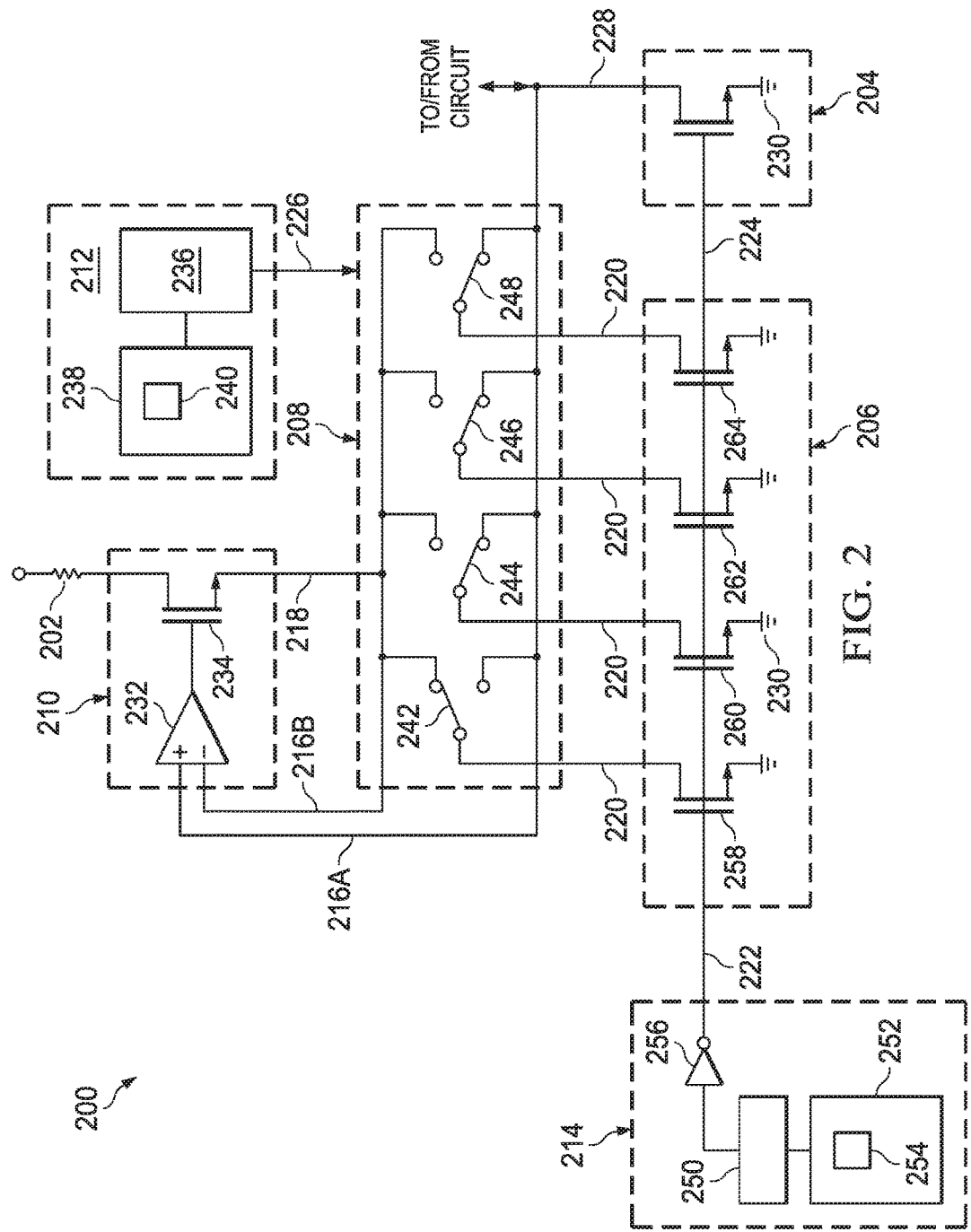
FIG. 2 is a schematic circuit diagram of an illustrative senseFET system in accordance with various examples.

FIG. 2 is a schematic circuit diagram of an illustrative senseFET system 200 in accordance with various examples. The system 200 is an illustrative embodiment of the system 100 depicted in FIG. 1. The system 200 may comprise a sense resistor 102 (e.g., 1 kOhms). The system 200 also may comprise a main MOSFET 204 (e.g., an n-type power MOSFET) and auxiliary MOSFETs 206 (e.g., n-type MOSFETs) comprising individual auxiliary MOSFETs 258, 260, 262, and 264. The individual auxiliary MOSFETs 258, 260, 262, and 264 have drains 220 and sources that may couple to a ground connection 230. The system 200 also may include a switch network 208 comprising individual switches 242, 244, 246, and 248 (e.g., transistor switches). The system 200 may further comprise a feedback voltage regulator 210 comprising an operational amplifier 232 and a feedback MOSFET 234. One input 216A to the operational amplifier 232 (e.g., at a non-inverting input) may couple to the drain of the main MOSFET 204 and to the drains of any individual auxiliary MOSFETs that may couple to the drain of the main MOSFET 204. Another input 216B to the operational amplifier 232 (e.g., at an inverting input) may couple to a source 218 of a feedback MOSFET 234 in the feedback voltage regulator 210, as well as to the drain of any individual auxiliary MOSFET that may couple to the source 218. An illustrative gain of the operational amplifier 232 may be, for instance, 1000. An output of the operational amplifier 232 may couple to and drive a gate of the feedback MOSFET 234. The drain of the feedback MOSFET 234 may couple to the series resistor 202.

The system 200 may further include a switching controller 212 comprising a processor 236 and storage 238 (e.g., random access memory (RAM), read-only memory (ROM)) storing executable code 240. The executable code 240, when executed by the processor 236, may cause the processor 236 to perform some or all of the actions attributed herein to the switching controller 212, including the switching control of each of the individual switches in the switch network 208 via connection 226. The drain of the main MOSFET 204 may couple to the connection 228, and the source of the main MOSFET 204 may couple to the ground connection 230.

The system 200 may also comprise a gate drive 214 that may include a processor 250 coupled to storage 252 (e.g., RAM, ROM) storing executable code 254. The executable code 254, when executed by the processor 250, causes the processor 250 to perform some or all of the actions attributed herein to the gate drive 214. For example, the processor 250 may use an inverter 256 to drive the gates of each of the individual auxiliary MOSFETs 258, 260, 262, and 264 and the main MOSFET 204 in the system 200 via connections 222 and 224. The switching controller 212 and gate drive 214 may be assembled from other components as well, including logic gates, flip flops, amplifiers, current sources, capacitors, resistors, comparators, and/or oscillators.

The system 200 is merely an illustrative, non-limiting embodiment of the more generic system 100 of FIG. 1. All variations of the system 200 are contemplated and included within the scope of this disclosure. For example, although a processor 236 and executable code 240 are used to control switching activity in the switch network 208, other switching control systems, such as a simple sequencer also may be used. Similarly, in the switch network 208, any suitable number of switches may be used, and in the auxiliary MOSFETs 206, any suitable number of individuals auxiliary MOSFETs may be used. Current flow through the various auxiliary and main MOSFETs may be in any suitable direction.

Operation of the system 200 is similar to operation of the system 100 and, therefore, is described here at only a general level. The processor 236 may control the individual switches in the switch network 208 so that at any given time, one of the individual auxiliary MOSFETs 206 may couple to the feedback voltage regulator 210 and, at the same time, the remaining auxiliary MOSFETs 206 all may couple in parallel to the main MOSFET 204. The processor 236, however, repeatedly changes which auxiliary MOSFET 206 couples to the feedback voltage regulator 210. In at least some embodiments, each of the individual auxiliary MOSFETs 206 has a turn to couple to the feedback voltage regulator 210 while all remaining auxiliary MOSFETs 206 couple to the main MOSFET 204. In the illustrative example of FIG. 2, there are four auxiliary MOSFETs, meaning that there are four possible auxiliary MOSFET states: a first state in which the auxiliary MOSFET 258 couples to the feedback voltage regulator 210 while the auxiliary MOSFETs 260, 262, and 264 couple to the main MOSFET 204; a second state in which the auxiliary MOSFET 260 couples to the feedback voltage regulator 210 while the auxiliary MOSFETs 258, 262, and 264 couple to the main MOSFET 204; a third state in which the auxiliary MOSFET 262 couples to the feedback voltage regulator 210 while the auxiliary MOSFETs 258, 260, and 264 couple to the main MOSFET 204; and a fourth state in which the auxiliary MOSFET 264 couples to the feedback voltage regulator 210 while the auxiliary MOSFETs 258, 260, and 262 couple to the main MOSFET 204. In some embodiments, the processor 236 regularly alternates between these four states. For example, the processor 236 may sequentially implement states one, two, three, and four, and it may then repeat this sequential process by again implementing states one, two, three, four, and so forth. In at least some embodiments, such switching occurs at a frequency between 1 Hz and 1 kHz, inclusive. In at least some embodiments, each of the four states is implemented for a common length of time.

When a particular auxiliary MOSFET 206 couples to the main MOSFET 204 via the switch network 208, that auxiliary MOSFET 206 may be exposed to the same or similar electrical and switching conditions as the main MOSFET 204. This is because the drain, gate, and source of that auxiliary MOSFET 206 couple to the drain, gate, and source of the main MOSFET 204, respectively. This results in the same voltages across the main and auxiliary MOSFETs and the same switching conditions at these MOSFETs. In addition, each such MOSFET experiences high current flow. As a result, and as explained in detail above, both the auxiliary MOSFET 206 and the main MOSFET 204 may experience similar hot carrier phenomena and thus there is minimal sizing ratio drift between the two MOSFETs. This maintains the integrity of the auxiliary MOSFET 206 for subsequent current sensing purposes.

When a particular auxiliary MOSFET 206 couples to the feedback voltage regulator 210, that auxiliary MOSFET 206 may operate as a sense MOSFET. Accordingly, the current flowing through the sense MOSFET may be the same or similar to the current flowing through the feedback MOSFET 234, which, in turn, may be the same or similar to the current flowing through the sense resistor 202. In prior and present current sensing applications, the sizing ratio drift between the sense MOSFET and the main MOSFET would have rendered current sensing efforts suboptimal. However, because of the repeated exposure of the auxiliary MOSFETs 206 to the same electrical and switching conditions as the main MOSFET 204, the sense MOSFET that couples to the feedback voltage regulator 210 has a stable sizing ratio relationship with the main MOSFET 204. Accordingly, the voltage across the sense resistor 202 may be measured and divided by the known resistance of the sense resistor 202, and the resulting current may be multiplied by the stable sizing ratio between the sense MOSFET and the main MOSFET 204 to accurately determine current flowing through the main MOSFET 204. As shown in FIG. 2, the auxiliary MOSFET 258 couples to the feedback voltage regulator 210 via switch 242, so the auxiliary MOSFET 258 operates as the sense MOSFET in this example. The feedback voltage regulator 210 may ensure that the voltage at the drain 220 of the auxiliary MOSFET 258 matches the voltage at the drain of the main MOSFET 204. Similarly, the remaining auxiliary MOSFETs 260, 262, and 264 all couple to the main MOSFET 204 and thus are being exposed to the same or similar electrical and switching conditions as the main MOSFET 204.

In some embodiments, trimming may be used to adjust the size of one or more of the main MOSFET 204 and the auxiliary MOSFETs 258, 260, 262, and 264. In some embodiments, the feedback voltage regulator regulates the voltage on an auxiliary MOSFET to a voltage related to the voltage on the main MOSFET, thus producing a current density in the auxiliary MOSFET that is related to but not necessarily identical to the current density in the main MOSFET. An illustrative relationship is to have the voltage across the auxiliary MOSFET be one-third of the voltage across the main MOSFET. In one embodiment, this may be accomplished using a resistor voltage divider in the feedback voltage regulator connections. In another embodiment, this may be accomplished using multiple auxiliary MOSFETs connected in series, so that each series-connected auxiliary MOSFET has a fraction of the drain-source voltage of the main MOSFET.

Figure 3:
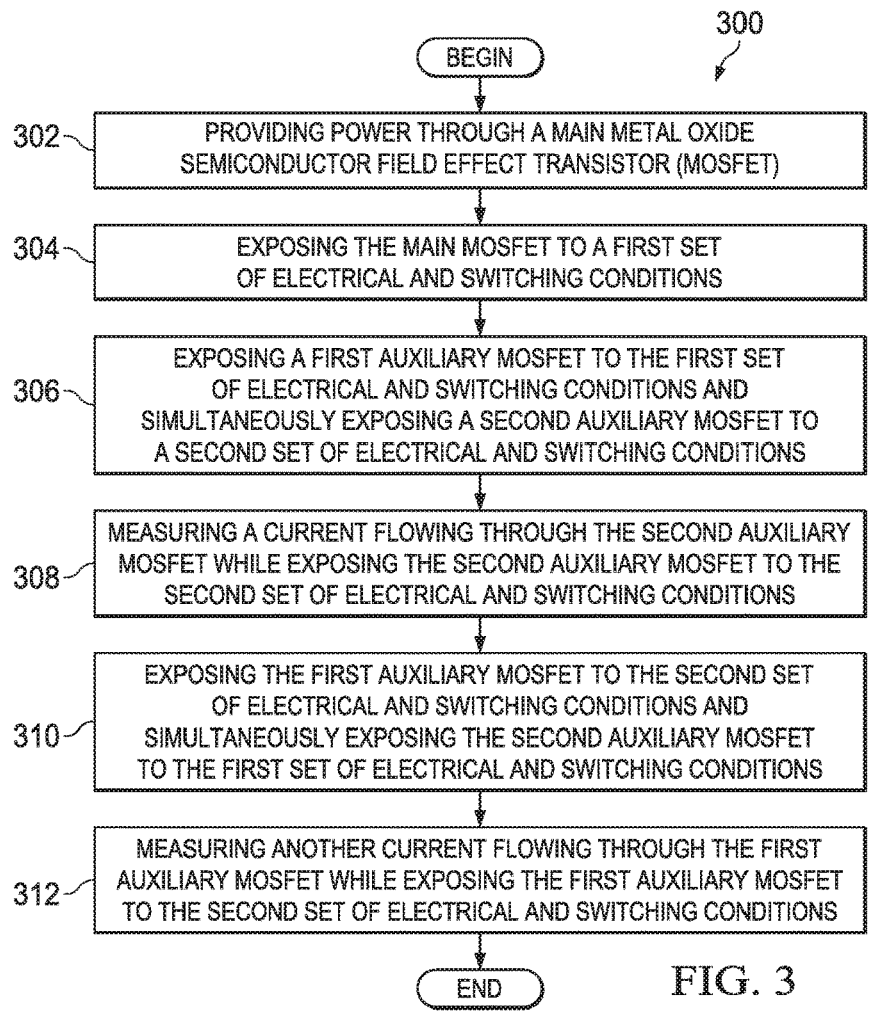
FIG. 3 is a flow diagram of an illustrative method of operating a senseFET system in accordance with various examples.

FIG. 3 is a flow diagram of an illustrative method 300 for operating a senseFET system in accordance with various examples. The method 300 begins by providing power through a main MOSFET (step 302) and exposing the main MOSFET to a first set of electrical and switching conditions (step 304). The method 300 may further comprise exposing a first auxiliary MOSFET to the first set of electrical and switching conditions and simultaneously exposing a second auxiliary MOSFET to a second set of electrical and switching conditions (step 306). With reference to FIGS. 1 and 2, the first auxiliary MOSFET in this illustrative method may be, for instance, an auxiliary MOSFET (e.g., auxiliary MOSFETs 260, 262, and 264 in FIG. 2) that couples to the main MOSFET and the second auxiliary MOSFET may be, for instance, an auxiliary MOSFET (e.g., auxiliary MOSFET 258 in FIG. 2) that couples to the feedback voltage regulator and that operates as a sense MOSFET.

The method 300 may then include measuring a current flowing through the second auxiliary MOSFET while exposing the second auxiliary MOSFET to the second set of electrical and switching conditions (step 308). Stated another way, the second auxiliary MOSFET is used as a sense MOSFET. The method 300 may then include exposing the first auxiliary MOSFET to the second set of electrical and switching conditions and simultaneously exposing the second auxiliary MOSFET to the first set of electrical and switching conditions (step 310). In this instance, the first auxiliary MOSFET operates as the sense MOSFET and the second auxiliary MOSFET is the auxiliary MOSFET that couples to the main MOSFET. The method 300 may then comprise measuring another current flowing through the first auxiliary MOSFET while exposing the first auxiliary MOSFET to the second set of electrical and switching conditions (step 312). Stated another way, the first auxiliary MOSFET is used as a sense MOSFET. Such repetition may continue for all MOSFETs in the set of auxiliary MOSFETs. The method 300 may be modified as desired, including by adding, deleting, modifying, and/or rearranging one or more steps.

The foregoing description is primarily provided in the context of switches that comprise MOSFETs. The scope of disclosure, however, is not limited to any particular type of switch. Other types of switches, such as insulated-gate bipolar transistors (IGBTs), may be used in tandem with or in lieu of one or more MOSFETs.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
    a power metal oxide semiconductor field effect transistor (MOSFET) configured to provide power in the system;
    a plurality of auxiliary MOSFETs; and
    a switch network configured to switchably and simultaneously couple a first of the plurality of auxiliary MOSFETs to the power MOSFET and a second of the plurality of auxiliary MOSFETs to a feedback voltage regulator, the switch network further configured to switchably and simultaneously couple the first of the plurality of auxiliary MOSFETs to the feedback voltage regulator and the second of the plurality of auxiliary MOSFETs to the power MOSFET,
    wherein the feedback voltage regulator is configured to cause a voltage at one or more of the plurality of auxiliary MOSFETs to match a voltage at the power MOSFET.

2. The system of claim 1, wherein the switch network is configured to couple the first of the plurality of auxiliary MOSFETs to the power MOSFET for a first length of time, and wherein the switch network is configured to couple the second of the plurality of auxiliary MOSFETs to the power MOSFET for a second length of time that is within a range spanning 90% of the first length of time to 110% of the first length of time, inclusive.

3. The system of claim 1, wherein the switch network is configured to switchably and simultaneously couple the first of the plurality of auxiliary MOSFETs to the power MOSFET such that at least some current flowing toward the power MOSFET is diverted to the first of the plurality of auxiliary MOSFETs.

4. The system of claim 1, wherein the feedback voltage regulator comprises an operational amplifier and a feedback MOSFET, an output of the operational amplifier coupled to a gate of the feedback MOSFET.

5. The system of claim 1, wherein the voltage at the one or more of the plurality of auxiliary MOSFETs is at a drain of the one or more of the plurality of auxiliary MOSFETs.

6. The system of claim 1, wherein the voltage at the power MOSFET is at a drain of the power MOSFET.

7. The system of claim 1, wherein, when the first and second of the plurality of auxiliary MOSFETs couple to the power MOSFET, a third of the plurality of auxiliary MOSFETs couples to the feedback voltage regulator, and wherein, when the first and third of the plurality of auxiliary MOSFETs couple to the power MOSFET, the second of the plurality of auxiliary MOSFETs couples to the feedback voltage regulator, and wherein, when the second and third of the plurality of auxiliary MOSFETs couple to the power MOSFET, the first of the plurality of auxiliary MOSFETs couples to the feedback voltage regulator.

8. A system, comprising:
    a main metal oxide semiconductor field effect transistor (MOSFET) configured to provide power;
    first, second, and third auxiliary MOSFETs, the main MOSFET and the first, second, and third auxiliary MOSFETs driven by a common gate drive signal;
    a feedback voltage regulator comprising an amplifier and a feedback MOSFET, an input of the amplifier coupled to a drain of the main MOSFET; and
    a switch network coupled to the main MOSFET, the feedback voltage regulator, and the first, second, and third auxiliary MOSFETs,
    wherein, in a first state, the switch network is configured to couple drains of the first and second auxiliary MOSFETs to the drain of the main MOSFET while the switch network couples the drain of the third auxiliary MOSFET to another input of the amplifier, the amplifier configured to adjust the feedback MOSFET to cause a voltage at the drain of the third auxiliary MOSFET to match a voltage at the drain of the main MOSFET,
    wherein, in a second state, the switch network is configured to couple the drains of the second and third auxiliary MOSFETs to the drain of the main MOSFET while the switch network couples the drain of the first auxiliary MOSFET to the another input of the amplifier, the amplifier configured to adjust the feedback MOSFET to cause a voltage at the drain of the first auxiliary MOSFET to match the voltage at the drain of the main MOSFET, and
    wherein, in a third state, the switch network is configured to couple the drains of the first and third auxiliary MOSFETs to the drain of the main MOSFET while the switch network couples the drain of the second auxiliary MOSFET to the another input of the amplifier, the amplifier configured to adjust the feedback MOSFET to cause a voltage at the drain of the second auxiliary MOSFET to match the voltage at the drain of the main MOSFET.

9. The system of claim 8, wherein the switch network is configured to switch between the first, second, and third states at a frequency between 1 Hz and 1 kHz, inclusive.

10. The system of claim 8, wherein the switch network implements the first, second, and third states for a common length of time.

11. The system of claim 8, wherein the main MOSFET comprises a power MOSFET.

12. The system of claim 8, wherein a conducting terminal of each of the main MOSFET and the first, second, and third auxiliary MOSFETs couple to a common node.

13. The system of claim 8, wherein the switching network implements the first, second, and third states in a sequential fashion and, after implementing the third state, the switching network again implements the first state.

14. The system of claim 8, further comprising a sense element coupled to the feedback voltage regulator, and wherein a current flowing through the sense element flows through at least one of the first, second, and third auxiliary MOSFETs.

15. A method, comprising:
providing power through a main switch;
exposing the main switch to a first set of electrical and switching conditions;
exposing a first auxiliary switch to the first set of electrical and switching conditions and simultaneously exposing a second auxiliary switch to a second set of electrical and switching conditions;
measuring a current flowing through the second auxiliary switch while exposing the second auxiliary switch to the second set of electrical and switching conditions;
exposing the first auxiliary switch to the second set of electrical and switching conditions and simultaneously exposing the second auxiliary switch to the first set of electrical and switching conditions; and
measuring another current flowing through the first auxiliary switch while exposing the first auxiliary switch to the second set of electrical and switching conditions.

16. The method of claim 15, wherein the main switch comprises a power MOSFET.

17. The method of claim 15, further comprising exposing a third auxiliary switch to the second set of electrical and switching conditions and simultaneously exposing the first and second auxiliary switches to the first set of electrical and switching conditions.

18. The method of claim 17, wherein, when any one of the first, second, and third auxiliary switches is exposed to the second set of electrical and switching conditions, the remaining ones of the first, second, and third auxiliary switches are exposed to the first set of electrical and switching conditions.

19. The method of claim 15, further comprising:
coupling a drain of the first auxiliary switch to a drain of the main switch when exposing the first auxiliary switch to the first set of electrical and switching conditions; and
regulating a voltage applied to the drain of the first auxiliary switch using a feedback voltage regulator when exposing the first auxiliary switch to the second set of electrical and switching conditions.

20. The method of claim 15, wherein measuring the current and the another current comprises using a sense resistor coupled to a feedback voltage regulator, the feedback voltage regulator switchably coupled to the first and second auxiliary switches.

* * * * *